United States Patent [19]

Baumann et al.

[11] Patent Number: 5,828,291

[45] Date of Patent: Oct. 27, 1998

[54] MULTIPLE COMPOUND CONDUCTOR CURRENT-LIMITING DEVICE

[75] Inventors: Thomas Baumann; Willi Paul, both of Wettingen; Jakob Rhyner, Zurich, all of Switzerland

[73] Assignee: ABB Research Ltd., Zurich, Switzerland

[21] Appl. No.: 647,951

[22] PCT Filed: Sep. 25, 1995

[86] PCT No.: PCT/CH95/00215

§ 371 Date: Jul. 30, 1996

§ 102(e) Date: Jul. 30, 1996

[87] PCT Pub. No.: WO96/10269

PCT Pub. Date: Apr. 4, 1996

[30] Foreign Application Priority Data

Sep. 29, 1994 [DE] Germany .......................... 44 34 819.3

[51] Int. Cl.⁶ ..................... H01L 43/00; H01L 43/12; H01H 47/00
[52] U.S. Cl. .................. 338/32 S; 505/881; 361/141
[58] Field of Search .................. 338/32 S; 505/881; 361/19, 141, 58

[56] References Cited

U.S. PATENT DOCUMENTS

| | | | |
|---|---|---|---|
| 3,335,295 | 8/1967 | Klinkhamer | 338/32 S |
| 4,961,066 | 10/1990 | Bergsjö et al. | 338/325 |
| 4,970,483 | 11/1990 | Wicker et al. | 505/211 |
| 4,994,932 | 2/1991 | Okamoto et al. | 361/19 |
| 5,153,804 | 10/1992 | Pham et al. | 361/19 |
| 5,235,309 | 8/1993 | Preisler et al. | 338/32 S |
| 5,250,508 | 10/1993 | Pham | 505/881 |
| 5,310,705 | 5/1994 | Mitlitsky et al. | 505/211 |
| 5,387,890 | 2/1995 | Estop et al. | 338/32 S |

FOREIGN PATENT DOCUMENTS

| | | |
|---|---|---|
| 0285147 A2 | 10/1988 | European Pat. Off. . |
| 0315460 A2 | 5/1989 | European Pat. Off. . |
| 0315976 A2 | 5/1989 | European Pat. Off. . |
| 0345767 A1 | 12/1989 | European Pat. Off. . |
| 0406636 A1 | 1/1991 | European Pat. Off. . |
| 0503448 A2 | 9/1992 | European Pat. Off. . |
| 0523374 A1 | 1/1993 | European Pat. Off. . |
| 2403 117 A1 | 7/1975 | Germany . |
| 4234311 A1 | 4/1994 | Germany . |
| 2-183915 | of 1990 | Japan . |
| 2-281765 | of 1991 | Japan . |

OTHER PUBLICATIONS

"Superconducting Fault Current Limiter", EPRI EL–329 (Research Project 328), Final Report, Dec. 1976, Argonne National Library, Argonne, Illinois.

K.J. Best et al., "Anisotrophy of Optimized and Not Optimized Technical NbTi Superconductors", IEEE Transactions on Magnetics vol. Mag–15, No. 1, Jan. 1979.

"Supraleitung", 4., uberarbeitete und erganzte Auflage, Werner Buckel, p. 236.

"Low Resistance Ohmic Contact for the Oxide Superconductor $EuBa_2Cu_3O_y$", Sugimoto et al., Japanese Journal of Applied Physics, vol. 27, No. 5, May 1988, pp. L864–L866.

Primary Examiner—Peter S. Wong
Assistant Examiner—Bao Q. Vu
Attorney, Agent, or Firm—Burns, Doane, Swecker & Mathis, L.L.P.

[57] ABSTRACT

A current limiting device including at least one superconductor and at least one nonsuperconducting shunt resistor in parallel with each superconductor. Each superconductor has a first main superconductor face in contact with a main shunt resistor face of a shunt resistor so as to form a compound conductor generally in the form of a meandering band having a band width greater than approximately 3.5 times the superconductor thickness. At least one insulator has opposing faces each in contact with a compound conductor. Multiple compound conductors are arranged such that current flows in opposite directions through adjacent compound conductors.

7 Claims, 2 Drawing Sheets

MULTIPLE COMPOUND CONDUCTOR CURRENT-LIMITING DEVICE

BACKGROUND OF THE INVENTION

1. Field of the Invention

The invention is based on a current limiter device.

2. Discussion of Background

Reference is made to U.S. Pat. No. 4,961,066, in which a current limiter is disclosed, for fast current limitation in the event of short circuits. The current limiter can include a support insulator which is rod shaped, tubular or a planar layer structure, in each case consisting of a support insulator. A thin superconducting layer is applied extensively thereon and a normal conductor resistive layer is applied extensively on the latter. The last two layers can be repeated one after the other. In this case, the resistance of the non-superconducting resistor is less than that of the superconductor in the normal conducting state. Disadvantages are large power losses in AC operation as well as relatively long conductors.

In regard to the relevant prior art, reference is also made to EP-A1-0,406,636. The latter provides, for limiting overcurrents in an electrical line of an AC circuit, for example as a result of a short circuit, a current limiter in which an induction coil is connected in a branch in parallel with a high temperature superconductor. The superconductor is arranged inside the induction coil and is also connected in parallel with a non-superconducting shunt resistor.

SUMMARY OF THE INVENTION

Accordingly, one object of the invention is to provide a further development of a current limiter device of the type mentioned at the outset in such a way that it is suitable for the resistive limitation of both direct and alternating currents. The intention is to limit an overcurrent, in the event of a short circuit, to a predeterminable multiple of the rated current.

An advantage of the invention consists in that the current limiter device is simple and compact. The superconducting part of the current limiter is of modular design, that is to say that the superconductor is subdivided into units which, should the need arise, can be removed and replaced separately.

According to an advantageous configuration of the invention, the compound conductors, consisting of superconductors and normal conductors, used in the current limiter can be arranged with low inductance. By virtue of a suitable conductor arrangement, AC losses which occur in the case of AC applications can be greatly reduced.

The current limiter device can also be used as an active switching element by introducing it into an external magnetic field. In this case, use is made of the fact that the critical current is very greatly reduced in magnetic fields. By switching on the external magnetic field, it is therefore possible to reduce the current in the superconductor to a fraction of the rated current.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
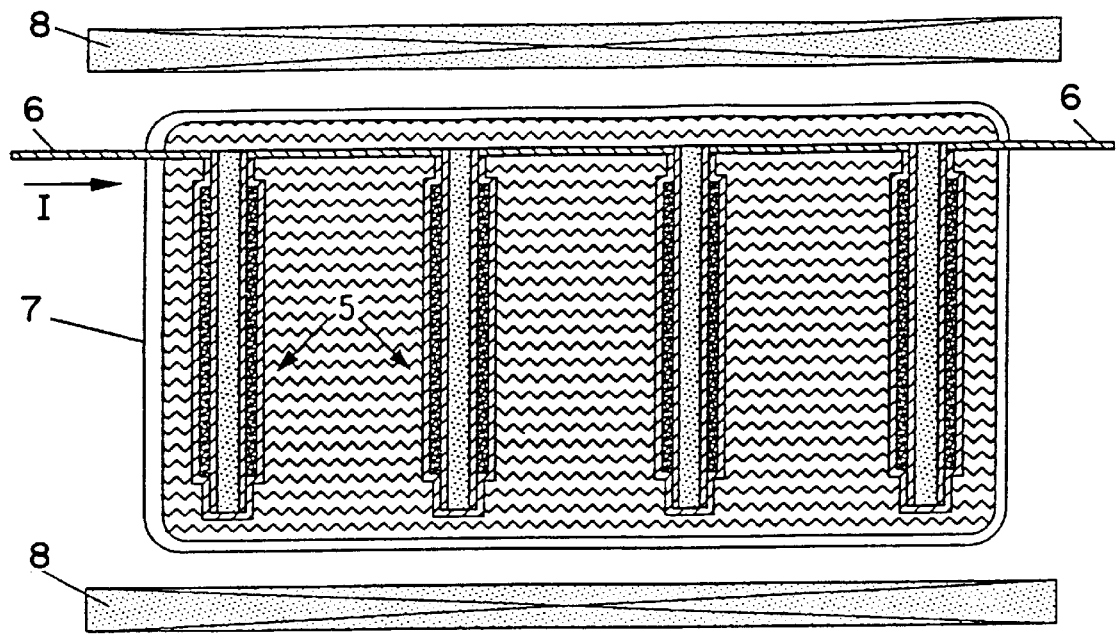
FIG. 1 shows, in cross section, a modular arrangement of current limiters in a magnetic field coil.

Referring now to the drawings, wherein like reference numerals designate identical or corresponding parts throughout the several views, FIG. 1 shows 4 current limiters or current limiter modules (5), which are arranged parallel to one another in a cryostat (7) filled with liquid nitrogen, are electrically connected in series and are connected to an electrical line (6). During operation, a current (I) which, in the event of an overcurrent, for example as a result of a short circuit, is intended to be limited by the current limiter modules (5) to 3 times–5 times a predeterminable rated current ($I_R$) which flows through the electrical line (6). The cryostat (7) is arranged within a magnetic field coil (8).

Figure 2:
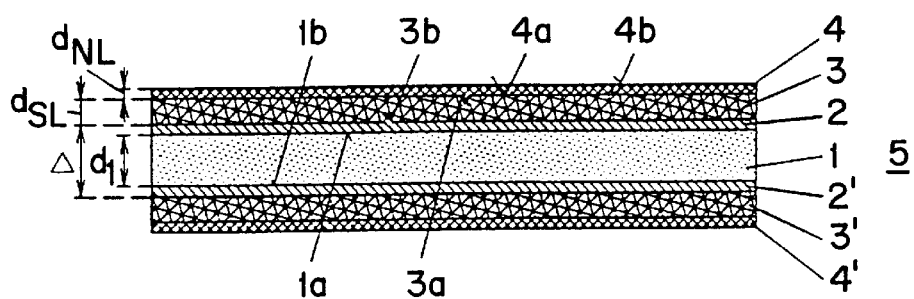
FIG. 2 shows, in cross section, a current limiter according to FIG. 1.

FIG. 2 shows the layer structure of a current limiter module (5) according to FIG. 1. A thin silver buffer layer (2) whose thickness is in the range of 1 $\mu$m to 5 $\mu$m is in each case applied onto a first main face (1a) and onto a second main face (1b), opposite the former, of a plate-shaped ceramic sheet or of an insulator (1) having a thickness ($d_1$). Suitable materials for the insulator (1) are insulators, obtainable in sheet form, which have sufficient thermal stability and undergo, between room temperature and 77 K., a long-term thermal alteration which is comparable with that of the superconductor (3, 3'). Glass fiber reinforced cast resin sheets or MgO ceramic sheets are preferably used. They are simply applied to the buffer layer (2) using a commercially available adhesive. This step is required for superconductor sheets (3, 3') which have been cast in a silver mold that is removed after casting, but is not required when using cast substrates on a nickel based alloy or ceramic which need not be removed after production of the superconductor (3, 3') and can be used for mechanically stabilizing the latter.

Figure 3:
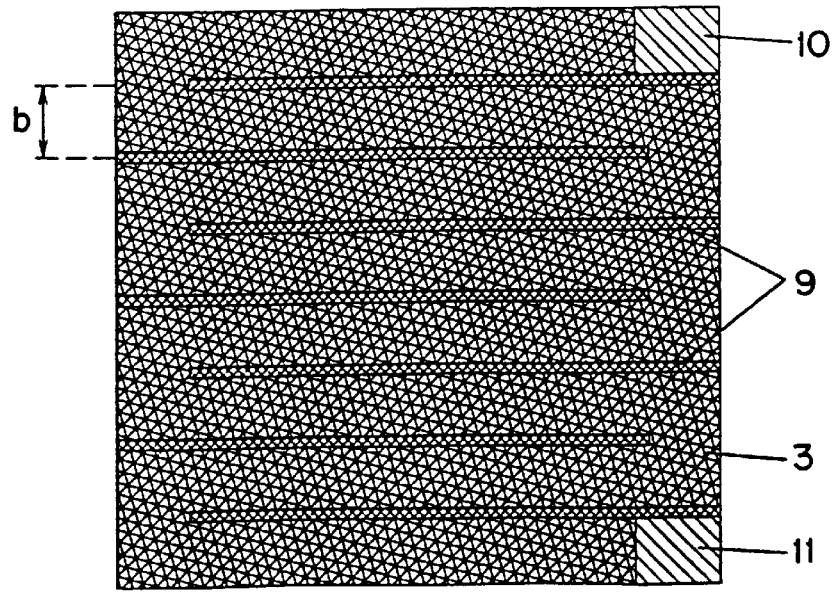
FIG. 3 shows, in a cross section, a superconductor of the current limiter according to FIG. 2, with a meandering conductor track.

Plate-shaped high temperature superconductors or superconductors (3, 3'). having rectangular cross sections and meandering configurations according to FIG. 3 and respective thicknesses ($d_{SC}$) are applied onto the two buffer layers (2), in extensive contact with the latter. In this case, a first main face (3) of each superconductor (3, 3') is, in order to electrically stabilize it, in good electrically. conductive contact with the respective buffer layer (2). The two superconductors (3, 3') have a mutual layer separation or conductor separation ($\Delta$).

A second main face (3b) of the respective superconductor (3, 3') is, in order to electrically and thermally stabilize it, in extensive good electrically conductive contact with a first main face (4a) of a respective non-superconducting resistor or normal conductor (4, 4') having a thickness ($d_{NC}$). A second main face of the normal conductor (4, 4'), opposite the first main face (4a), is designated (4b). Suitable metals for the normal conductors (4, 4') are, in particular, those which have a resistivity at room temperature of >10 $\mu\Omega$ cm and are still ductile at −200° C. Preferable ones are: tin, zinc, bismuth and alloys thereof as well as non-magnetic metals based on steel or nickel. The normal conductors (4, 4') can be applied onto the superconductor (3, 3') by electrolytic methods, flame spraying, plasma spraying, bonding using a conductive adhesive, soldering or sintering a cold-sprayed metal powder. The thickness of the normal conductor layer (4, 4') should be such that the electrical resistance of this layer is approximately equal to that of the adjoining superconductor layer (3, 3') in the non-superconducting state, for example 50 μm when the thickness ($d_{SC}$) of the superconductor (3, 3') is 1 mm. The contact resistivity, expressed in terms of area, between the second main face (3b) of the superconductors (3, 3') and the first main face (4a) of the normal conductors (4, 4') should be <1 mΩ cm$^2$, preferably ≦10 μΩ cm$^2$.

FIG. 3 shows a cross section through the superconductor (3) according to FIG. 2, in a section that is perpendicular to the layer representation in FIG. 2. A band-shaped conductor is produced using cuts or meander gaps (9) in a sheet with a rectangular, preferably square contour. Silver contacts (10, 11) are applied to this conductor at the end, for electrically connecting it. Neighboring meander gaps (9) have a perpendicular separation (b). corresponding to a meander path width. The meanders are most simply produced by reciprocal cuts by milling or sawing or laser or water-jet cutting, and this can be done before applying the normal conductor (4, 4') or else before applying the mechanical stabilization, i.e., is to say the insulator (1).

The meandering superconductors (3, 3') are arranged, in the current limiter modules (5), on both sides of the insulator (1) in such a way that the current (I) flows in the opposite direction in respectively opposite meander paths, so that the self-field components perpendicular to the band plane compensate for each other. The effect of this is that the current limiter modules (5) are low-inductance and low-loss.

Figure 4:
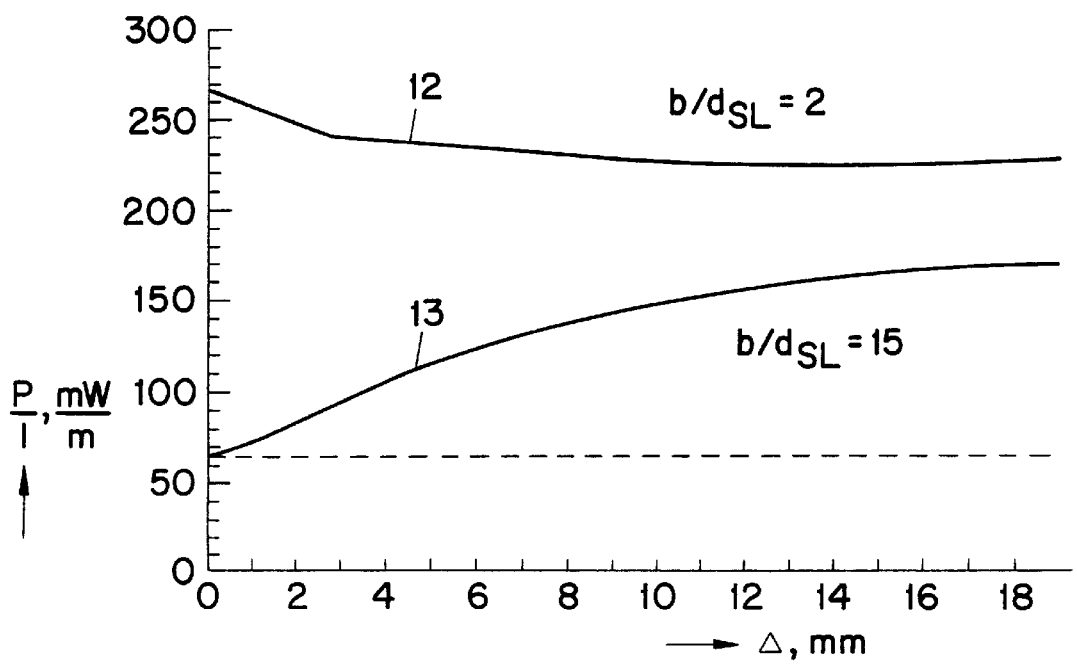
FIG. 4 shows signal diagrams of AC losses with current limiters.

FIG. 4 shows, in AC loss curves (12) and (13) for different values of the ratio of the meander path width (b) to the thickness ($d_{SC}$) of the superconductor (3, 3'), the AC losses which occur in the abovementioned current return line. In this case the conductor separation (Δ) in mm is plotted on the abscissa and the ratio of the electrical AC power loss (P) to a length (l) of the superconductor (3, 3') in mW/m is plotted on the ordinate. The AC loss curve (12) shows that, for $b/d_{SC}=2$, the AC losses decrease with increasing conductor separation (Δ). In comparison, the AC loss curve (13) shows that while with $b/d_{SC}=15$ the AC losses increase with increasing conductor separation (Δ). The current return arrangement in a current limiter module (5) only leads to a reduction in the losses with increasing conductor separation (Δ) when the meander track of the superconductor (3, 3') is sufficiently flat, that is to say when the ratio $b/d_{SC}$ is sufficiently large, up to a critical value of 3.5. For bands with $b<3.5 \cdot d_{SC}$, the current return increases the AC power loss (P) instead of reducing it.

FIGS. 5–8 show a simplified representation of various layer sequences which can be used instead of the layer structure in FIG. 2. In this case (NC) designates normal conductors (4, 4', 14, 15) and (SC) designates superconductors (3, 3').

Figure 5:
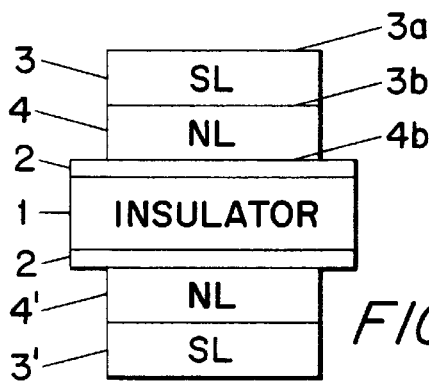
FIGS. 5–8 show current limiters with different layer sequences.

According to FIG. 5, a compound conductor or laminate consisting of a normal conductor (4, 4') and a superconductor (3, 3') can be extensively connected to the insulator (1) or the respective buffer layer (2) in such a way that the normal conductor (4, 4') is in each case arranged on the insulator side.

Figure 6:
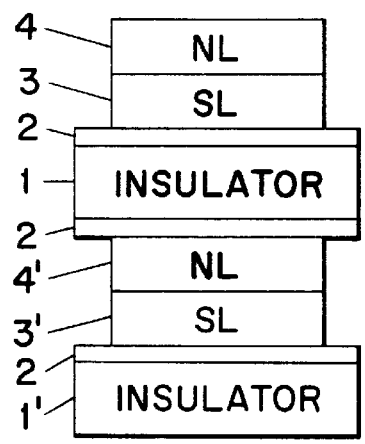

According to FIG. 6, a compound conductor consisting of a normal conductor (4, 4') and a superconductor (3, 3') can be extensively connected to the insulator (1) or the respective buffer layer (2) in such a way that the insulator (1) is in superficial contact, via one of its main faces, with the superconductor (3), according to the arrangement of FIG. 2, and via its other main face with a normal conductor (4'), according to the arrangement of FIG. 5. It is also possible to provide a further insulator (1') which is extensively connected to the superconductor (3') via a buffer layer (2).

Figure 7:
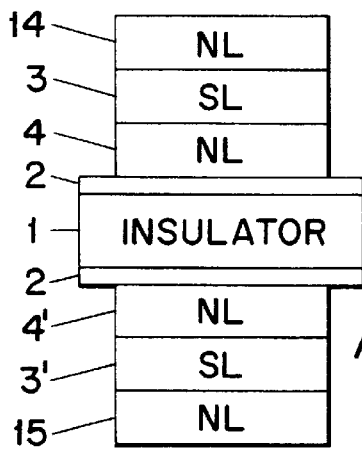

FIG. 7 shows a layer structure according to FIG. 5, in which the outer faces of the superconductors (3, 3') are in extensive, highly conductive electrical contact with additional normal conductors (14) and (15).

Figure 8:
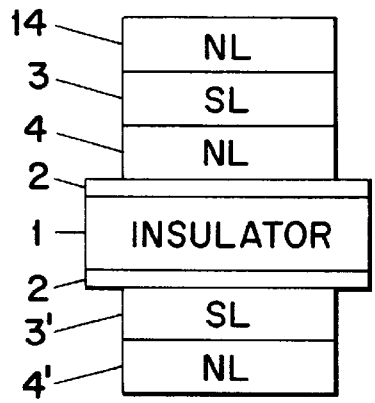

FIG. 8 shows a current limiter module (5) which has a layer structure according to FIG. 7 on one side of the insulator (1) and a layer structure according to FIG. 2 on the other side.

In the current limiter modules (5) according to FIG. 1, the superconductors (3, 3') are resistively coupled into an electrical circuit. Below a certain critical current strength ($j_c$) the superconductor (3, 3') is in the superconducting state and therefore has virtually no electrical resistance. If the critical current strength is exceeded, for example because of a short circuit, then the superconductor (3, 3') undergoes transition into its normal conducting state. The resistance which results therefrom limits the current to a value which is much smaller than the short circuit current.

Important factors are the dimensioning of the superconductor (3, 3'), its electrical, thermal and mechanical stabilization, the AC losses which result during operation and the connections between the current limiter modules (5).

The electrical and thermal stabilization is achieved using at least one normal conductor (4, 4', 14, 15) as a parallel conductor, which must locally be in good electrical and thermal contact with the superconductor (3, 3'). This bypass resistor (4, 4', 14, 15) can, should need be, locally take a part of the current from the superconductor (3, 3') and thereby protect the latter from excessive heating and destruction. In order for it to be possible to relieve the load on the superconductor (3, 3') effectively, the bypass resistance (4, 4', 14, 15) should not be greater than the normal resistance of the superconductor (3, 3'). The thickness ($d_{NC}$) of the bypass resistor (4, 4', 14, 15) must consequently be $\geq d_{SC} \rho_{NC}/\rho_{SC}$, $\rho_{NC}$ and $\rho_{SC}$ being the resistivities of the bypass resistor (4, 4', 14, 15) and of the superconductor (3, 3'), respectively. Since the intention is for the bypass resistor (4, 4', 14, 15) to receive as much heat as possible, a high thermal inertia and consequently a high resistivity $\rho_{NC}$ are beneficial.

In the operating state, the superconductor (3, 3') must be able to carry the rated current ($I_R$), which gives a lower limit for its cross-sectional area F, according to:

$$F \geq 1.414 \cdot I_R/j_c.$$

In the limiter state the current (I) is intended to rise to at most n times the rated current ($I_R$), values of between 3 and 5 being required in practice. This requirement gives the minimum conductor length (l) of the superconductor (3, 3'), according to:

$$l \geq b \cdot (d_{SC}/\rho_{SC} + d_{NC}/\rho_{NC}) \cdot 1.414 \cdot U_R/(\ln \cdot I_R),$$

$U_R$ being the rated voltage of a current source (not represented) and b being the strip width of a compound conductor consisting of a bypass resistor (4, 4', 14, 15) and a superconductor (3, 3').

The AC power loss (P) of a superconductor (3, 3') through which current flows depends greatly on the local magnetic field (self-field and possible external fields). In the case of band-shaped superconductors (3, 3'), as they are used according to FIG. 1, above all the field components which are perpendicular to the band plane have a very unfavorable effect on the AC power loss (P). The conductor geometry must therefore be realized in such a way that the field in the superconductor (3, 3') is oriented predominantly parallel to the band plane. In a single thin current-carrying band, the magnetic field in the conductor is for the most part perpendicular to the band plane, in which case the AC power loss (P) would not be acceptable for the application. An efficient reduction in the perpendicular field components can be achieved with a conductor geometry which consists of pairs of closely adjacent conductor segments, perpendicular to the band plane, with antiparallel current (I). For each pair of such conductors the magnetic field in the conductor is for the most part parallel to the band plane, which results in a substantially smaller AC power loss (P). The AC power loss (P) per unit conductor length (l) is given by:

$$P/l = 4 \cdot j_c \cdot [-A(x_{ec}) \cdot F + (\int) A(x) \, df]$$

A(x) being the vector potential at maximum current, $x_{ec}$ being the so-called electrical center of the superconducting band, at which the electric field is always =0, and F being the cross-sectional area of the band. The integral extends over the entire conductor cross section F. It can be seen from the above formula that the current return concept is effective if the conductor separation ($\Delta$) of the superconductors (3, 3') perpendicular to the band plane is substantially less than the meander path width (b). For $\Delta \gg b$, the superconductors (3, 3') behave as 2 individual conductors with high AC power loss (P). For b=2 mm and $d_{SC}$=0.5 mm, with current return a reduction in the AC power loss (P) by a factor of 2 can be achieved. The current return design can be realized with bands arranged in meander or spiral form, cf. FIG. 3. In this case the conductor separation ($\Delta$) is preferably selected to be <10 mm.

EXAMPLE 1
With Layer Structure According To FIG. 2

| | |
|---|---|
| Rated power $P_R$ | 20 kW, |
| Rated voltage $U_R$ | 200 V, |
| Rated current $I_R$ | 100 A, |
| Maximum current $I_{max}$ | 300 A, |
| Critical current density $j_c$ | 1 kA/cm$^2$, |
| Conductor width b | 1.4 cm, |
| Meander gap width (9) | 1 mm, |
| Conductor length 1 per module (5) | 126 cm, |
| Total conductor length | 8.8 m, |
| Number of modules (5) | 7, |
| AC power loss P at 77K | 0.62 W. |

A modularly designed high temperature superconductor (3, 3') based on Bi:Sr:Ca:Cu=2:2:1:2 was applied to a thickness ($d_{SC}$) of 1 mm onto both sides of a ceramic sheet (1) with an area of 10 cm·10.4 cm and a thickness ($d_1$) of 1 mm. There was a silver layer (2) with a thickness of 2 μm between the ceramic sheet (1) and the superconductor (3, 3'). The silver acts both as an electrical stabilizer (bypass resistor) and as a chemical insulator between the superconductor (3, 3') and the ceramic substrate (1). A lead layer (4, 4') with a thickness ($d_{NC}$) of 10 μm, which likewise contributes to the electrical stabilization, was applied to the other side of the superconductor (3, 3').

Meander gaps (9) according to FIG. 3 were cut from the superconducting layer on both sides of the sheet. The two conductor tracks (3, 3') on both sides of the ceramic sheet (1) are electrically connected to each other in such a way that the current (I) in directly opposite band parts flows in antiparallel directions. The current return effect for reducing the AC power loss (P) is thereby achieved.

EXAMPLE 2
Switch Function According To FIG. 1

By enclosing the current limiter modules (5) according to Example 1 with a magnetic field coil (8), as represented in FIG. 1, the device according to the invention can be used as an active switching element. When the magnetic field is turned on, the critical current strength ($j_c$) in the superconductor (3, 3') is reduced, so that the superconductor (3, 3') undergoes transition into the resistive state. This causes the current (I) to be reduced to a fraction of the rated current ($I_R$. Because of the texturing of the superconductor (3, 3'), the reduction in the critical current strength ($j_c$) is a maximum if the applied magnetic field is perpendicular to the plane of the superconducting band, as in FIG. 1.

Production of a superconducting sheet (1)

Superconductor powder of composition $Bi_a Sn_b Ca_c Cu_d O_e$ with a, b, d=1.8–2.2, c=0.8–1.2, e=7.5–8.5 is introduced, in the dry state or as a suspension with a liquid, into a suitable flat mold. In a preferred procedure, silver powder and/or $Bi_2O_3$ powder is mixed in a concentration range of 0.5%–5% with this superconductor powder, which has a positive influence on the melting and compacting of the melt. Any material which does not react with the powder during the subsequent melting of the powder and is structurally stable at temperatures of around 900° C. is suitable as a casting mold. Molds made of sheet silver, of nickel alloys with a silver protective layer and ceramic sheets made of magnesium oxide and stabilized zirconium oxide were used. The metal molds were easily able to be provided, for example by deep drawing or folding, with a rim having a height of approximately 10 mm. Conductive silver was used as the buffer layer (2) or adhesive. The filling level was selected in such a way that, when the powder was compacted to 100% by the melting, a thickness ($d_{SC}$) of 0.3 mm–3 mm results. The highest possible so-called green density of the powder, which was achieved by uniaxial subsequent pressing of the loose powder bed, is advantageous for the achievable current density and homogeneity. A pressure of 10 MPa is sufficient for this. The casting method is described in DE-A1-4,234,311.

Application of the Electrical Stabilization

Superconductor sheets (1), which were produced in silver or ceramic molds, were provided with a metallization (4, 4', 14, 15) which serves as electrical stabilization. For this purpose the silver must be removed from the superconductor sheet (1), which can be done before the metallization or after a mechanical stabilization has been applied.

When casting molds of silvered nickel-based alloy are used, separate electrical stabilization is not necessary if the resistance of the silver/nickel-based alloy combination already corresponds to that of the superconductor (3, 3').

EXAMPLE 3

Square casting molds with dimensions of 100 mm·100 mm, having rims with a height of 6 mm, were folded by hand from a 100 μm thick silver sheet. These casting molds were in each case filled with a slurry of 60 g $Bi_2Sr_2Ca_1Cu_2O_8+\delta$ powder in ethanol, $0 \leq \delta \leq 0.3$. After the liquid had dried, the powder bed was compressed by uniaxial pressing with a pressure of 2 GPa. The specimens were then subjected to a heat treatment, in an oxygen atmosphere, which consisted of a melting step at 900° C. for a period of time in the range from 20 h–80 h. Homogeneous compact superconductor sheets (3, 3') with a thickness of approximately 1 mm, from which the silver could easily be shaved off, were obtained as a result. A 50 μm thick tin layer was deposited onto these superconductor sheets (3, 3') by flame spraying for electrical stabilization. These superconductor sheets (3, 3') were then adhesively bonded onto an aluminum sheet and made into a meandering form by water-jet cutting, conductors with a cross section of 14 mm·1 mm and a length of approximately 70 cm being produced as a result. After the aluminum sheet had been removed, 2 superconductor sheets (3, 3') were in each case aligned relative to each other in such a way that their tracks on the front and rear side of the ceramic sheet (1) run parallel and the ends with the silver contacts (10, 11) are on top of each other. The silver contacts (10, 11) are bonded on with a silver-filled epoxy resin adhesive, and the ends can be connected in series with low impedance using them. The contact resistivity of the adhesive bond with silver-filled epoxy resin is 0.05 $\mu\Omega$ cm$^2$. At a current (I) of 1 kA the current limiter module (5) formed a resistance of 5Ω.

It is expedient to select the ratio of the conductor separation (Δ) to the meander path width (b) of a current limiter module (5) at <0.5, preferably <0.1.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A current-limiting device, comprising:
    at least one superconductor;
    at least one non-superconducting shunt resistor in parallel with each superconductor, each superconductor having a first main superconductor face in contact with a main shunt resistor face of a shunt resistor so as to form a compound conductor generally in the form of a meandering band having a band width greater than approximately 3.5 times the superconductor thickness;
    at least one insulator having opposing faces each contact with said compound conductor, wherein
    multiple compound conductors are arranged with respect to each other such that current flows in opposite directions through adjacent compound conductors, and wherein
    a superconductor separation of superconductors on opposite sides of an insulator, perpendicular to the plane of the meandering band, is smaller than the band width.

2. The device of claim 1, wherein the band width is greater than approximately 10 times the superconductor thickness.

3. The device of claim 1, wherein:
    each shunt resistor has an electrical resistance not greater than the electrical resistance of the connected superconductor in a non-superconducting state of the connected superconductor; and
    each superconductor has a minimum conductor length l, where $$l > b \times (d_{SC}/\rho_{SC} + d_{NC}\rho_{NC}) \times (1.414) \times Ur(nI_r),$$

wherein $d_{SC}$ in the thickness of the superconductor, $d_{NC}$ is the thickness of the shunt resistor, $\rho_{SC}$ and $\rho_{NC}$ are resistivity values of the superconductor and shunt resistor, respectively, $I_r$ is a rated current and Ur is a rated voltage of a current source, n is a ratio of maximum permissible current to $I_r$, and b is a strip width of the compound conductor.

4. The device of claim 1, wherein the superconductor separation is less than approximately 10 mm.

5. The device of claim 1, wherein one of the at least one superconductor is in contact with a second insulator.

6. The device of claim 1, wherein the superconductor separation is less than approximately one-half the band width.

7. The device of claim 6, wherein the superconductor separation is less than approximately one-tenth of the band width.

* * * * *